(12) United States Patent
Kyung

(10) Patent No.: US 6,956,780 B2
(45) Date of Patent: Oct. 18, 2005

(54) SEMICONDUCTOR MEMORY DEVICE HAVING DIRECT SENSE AMPLIFIER IMPLEMENTED IN HIERARCHICAL INPUT/OUTPUT LINE ARCHITECTURE

(75) Inventor: Kye-Hyun Kyung, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 195 days.

(21) Appl. No.: 10/417,098

(22) Filed: Apr. 17, 2003

(65) Prior Publication Data

US 2003/0214866 A1 Nov. 20, 2003

(30) Foreign Application Priority Data

May 14, 2002 (KR) ................................ 10-2002-0026433

(51) Int. Cl.$^7$ ................................................ G11C 7/00
(52) U.S. Cl. .......................... 365/205; 365/190; 365/63
(58) Field of Search ................................ 365/205, 190, 365/63

(56) References Cited

U.S. PATENT DOCUMENTS 6,172,918 B1 * 1/2001 Hidaka ........................ 365/190

* cited by examiner

Primary Examiner—Huan Hoang
(74) Attorney, Agent, or Firm—Volentine Francos & Whitt, pllc

(57) ABSTRACT

A semiconductor memory device having a hierarchical input/output architecture, includes a direct sense amplifier which is implemented without increasing the chip area and the number of interconnection lines of the device. The semiconductor memory device includes a pair of write control switches which are connected between a pair of local input/output lines and a pair of global input/output lines, and which connect the pair of local input/output lines and the pair of global input/output lines in response to a write control signal. Also, the semiconductor memory device includes a direct sense amplifier which is connected to the pair of local input/output lines and the pair of global input/output lines and generates a voltage difference, corresponding to a voltage difference between the pair of local input/output lines, between the pair of global input/output lines in response to a read control signal.

21 Claims, 7 Drawing Sheets

US 6,956,780 B2

SEMICONDUCTOR MEMORY DEVICE HAVING DIRECT SENSE AMPLIFIER IMPLEMENTED IN HIERARCHICAL INPUT/OUTPUT LINE ARCHITECTURE

CROSS REFERENCES TO RELATED APPLICATIONS

This application claims priority under 35 U.S.C. §119 from Korean Patent Application No. 2002-26433, filed on May 14, 2002, the contents of which are hereby incorporated by reference in their entirety for all purposes as if fully set forth herein.

BACKGROUND AND SUMMARY

1. Technical Field

The present invention relates to a semiconductor memory device, and more particularly, to a direct sense amplifier that is implemented in a semiconductor memory device having a hierarchical input/output line architecture.

2. Description

Generally, DRAMs use shared sense amplifiers. However, in a DRAM having a shared sense amplifier, when one wordline is activated in a specific memory cell array block, data can be accessed only by the number of pairs of input/output lines included in sense amplifiers on either side of the specific memory cell array block, regardless of the number of memory cells connected to the wordline. Due to this, it is difficult to access a large amount of data at the same time. To solve this problem, as shown in FIG. 1, a hierarchical input/output line architecture, which includes pairs of local input/output lines LIO, /LIO and pairs of global input/output lines GIO, /GIO, has been suggested.

In the hierarchical input/output line architecture shown in FIG. 1, pairs of local input/output lines LIO/LIO are connected to pairs of global lines GIO, /GIO via switches SW that are controlled by a block information signal BLKx. Data of pairs of bitlines BL, /BL is sense-amplified by bitline sense amplifiers 11 through 14. Data of the sense-amplified pairs of bit lines BL, /BL is transmitted to pairs of local input/output lines LIO, /LIO via column select transistors CT when column select lines CSL are activated and data of pairs of local input/output lines LIO, /LIO is transmitted to pairs of global input/output lines GIO, /GIO via the switches SW. Data of pairs of global input/output lines GIO, /GIO is amplified by input/output line sense amplifiers 15 and 16. In such a hierarchical input/output line architecture, the number of data accessible when one wordline is activated can be increased by controlling the lengths of pairs of local input/output lines LIO, /LIO.

As a method of reducing read latency in a DRAM having a general sense amplifier architecture, direct sense amplifier architectures as shown in FIGS. 2A and 2B have been proposed. In the direct sense amplifier architecture shown in FIG. 2A, in a write operation, data of input/output lines IO, /IO is transmitted to pairs of bitlines BL, /BL via transistors T1 and T2. In a read operation, charge of pairs of input/output lines IO, /IO is discharged to ground VSS via transistors T3 and T5 and transistors T4 and T6. Here, conductance of the transistor T5 controlled by a voltage of a bitline BL is different from conductance of the transistor T6 controlled by a voltage of a complementary bitline /BL. Thus, the amount of discharge of an input/output line IO is different from the amount of discharge of a complementary input/output line /IO. As a result, a potential difference occurs between the input/output line IO and the complementary input/output line /IO.

In the direct sense amplifier architecture shown in FIG. 2B, in the write operation, data of input/output lines IO, /IO is delivered to a pair of bitlines BL, /BL via transistors T7 and T8. In the read operation, charge of a pair of input/output lines IO/IO is discharged to ground VSS via transistors T9, T11, and T13 and transistors T10, T12, and T14. Here, conductance of the transistor T13 controlled by a voltage of a bitline BL is different from conductance of the transistor T14 controlled by a voltage of a complementary bitline /BL. Thus, the amount of discharge of the input/output line IO is different from the amount of discharge of the complementary input/output line /IO. As a result, a potential difference occurs between the input/output line IO and the complementary input/output line /IO. However, in the direct sense amplifier architecture, since several additional transistors are required in sense amplifier areas of each of pairs of bit lines, the chip area increases. Also, since a write column select line WCSLi and a read column select line RCSLi are respectively required, the number of interconnection lines doubles.

Accordingly, it would be desirable to provide a semiconductor memory device having a hierarchical input/output architecture and a direct sense amplifier which is implemented in the hierarchical input/output line architecture without increasing the chip area and the number of interconnection lines.

According to an aspect of the present invention, there is provided a semiconductor memory device including a pair of write control switches and a direct sense amplifier. The pair of write control switches is connected between a pair of complementary local input/output lines and a pair of complementary global input/output lines, and connects the pair of complementary local input/output lines and the pair of complementary global input/output lines in response to a write control signal. The direct sense amplifier is connected to the pair of complementary local input/output lines and the pair of complementary global input/output lines. The direct sense amplifier generates a voltage difference, corresponding to a voltage difference between the pair of complementary local input/output lines, between the pair of complementary global input/output lines in response to a read control signal.

In this aspect, the direct sense amplifier includes first through fourth direct sense amplifier switches. The first direct sense amplifier switch has an end connected to one of the complementary global input/output lines and responds to the read control signal. The second direct sense amplifier switch has an end connected to the other end of the first direct sense amplifier switch and the other end connected to ground and responds to a signal on one of the complementary local input/output line. The third direct sense amplifier switch has an end connected to a second (complementary) line of the complementary global input/output lines and responds to the read control signal. The fourth direct sense amplifier switch has an end connected to the other end of the third direct sense amplifier switch and the other end connected to ground and responds to a signal of a second (complementary) line of the complementary local input/output lines. Beneficially, the first through fourth direct sense amplifier switches are NMOS transistors.

The write control signal is generated by a logical combination of an inverted read signal, representing a read operation, and a block select signal for a memory cell array block. The read control signal is generated by a logical combination of the read signal and the block select signal.

According to another aspect of the present invention, there is also provided a semiconductor memory device including a pair of write control switches which is connected between a pair of complementary local input/output lines and a pair of complementary global input/output lines and responds to a write control signal, and a direct sense amplifier which is connected to the pair of local input/output lines and the pair of global input/output lines and generates a voltage difference, corresponding to a voltage difference between the pair of complementary local input/output lines, between the pair of complementary global input/output lines in response to a read signal representing a read operation and a block select signal for a memory cell array block.

In this aspect, the direct sense amplifier includes first through sixth direct sense amplifier switches. The first direct sense amplifier switch has an end connected to one of the complementary global input/output lines and responds to the read signal. The second direct sense amplifier switch has an end connected to the other end of the first direct sense amplifier switch and responds to the block select signal. The third direct sense amplifier switch has an end connected to the other end of the second direct sense amplifier switch and the other end connected to ground and responds to a signal of the complementary local input/output line. The fourth direct sense amplifier switch has an end connected to a second (complementary) line of the complementary global input/output lines and responds to the read signal. The fifth direct sense amplifier switch has an end connected to the other end of the fourth direct sense amplifier switch and responds to the block select signal. The sixth direct sense amplifier switch has an end connected to the other end of the fifth direct sense amplifier switch and the other end connected to ground and responds to a signal of a second (complementary) line of the complementary local input/output lines. Beneficially, the first through sixth direct sense amplifier switches are NMOS transistors.

The write control signal is generated by a logical combination of an inverted read signal and the block select signal.

According to still another aspect of the present invention, there is also provided a semiconductor memory device including a pair of write control switches which is connected between the pair of complementary local input/output lines and the pair of complementary global input/output lines and responds to an inverted signal of a read signal representing a read operation and a block select signal for a memory cell array block, and a direct sense amplifier which is connected to the pair of complementary local input/output lines and the pair of global input/output lines and generates a voltage difference, corresponding to a voltage difference between the pair of complementary local input/output lines, between the pair of complementary global input/output lines in response to the read signal and the block select signal.

In this aspect, the direct sense amplifier includes first through sixth direct sense amplifier switches. The first direct sense amplifier switch has an end connected to one of the complementary global input/output lines and responds to the read signal. The second direct sense amplifier switch has an end connected to the other end of the first direct sense amplifier switch and responds to the block select signal. The third direct sense amplifier switch has an end connected to the other end of the second direct sense amplifier switch and the other end connected to ground and responds to a signal of one of the complementary local input/output lines. The fourth direct sense amplifier switch has an end connected to a second (complementary) line of the complementary global input/output lines and responds to the read signal. The fifth direct sense amplifier switch has an end connected to the other end of the fourth direct sense amplifier switch and responds to the block select signal. The sixth direct sense amplifier switch has an end connected to the other end of the fifth direct sense amplifier switch and the other end connected to the ground and responds to a signal of a second (complementary) line of the complementary local input/output lines. Beneficially, the first through sixth direct sense amplifier switches are NMOS transistors.

The pair of write control switches includes a first switching device which has an end connected to one of the pair of complementary local input/output lines and responds to the block select signal, and a second switching device which has an end connected to the other end of the first switching device and the other end connected one of the pair of complementary global input/output lines and responds to the inverted signal of the read signal. Beneficially, the first and second switching devices are NMOS transistors.

According to a further aspect of the present invention, there is provided a semiconductor memory device including a pair of write control switches which is connected between a pair of complementary local input/output lines and a pair of complementary global input/output lines and responds to an inverted read signal, representing a read operation, and a block select signal for a memory cell array block, and a direct sense amplifier which is connected to the pair of complementary local input/output lines and the pair of complementary global input/output lines and generates a voltage difference, corresponding to a voltage difference between the pair of complementary local input/output lines, between the pair of complementary global input/output lines in response to a read control signal.

In this aspect, the direct sense amplifier includes first through fourth direct sense amplifier switches. The first direct sense amplifier switch has an end connected to one of the complementary global input/output lines and responds to the read control signal. The second direct sense amplifier switch has an end connected to the other end of the first direct sense amplifier switch and the other end connected to ground and responds to a signal of the complementary local input/output line. The third direct sense amplifier switch has an end connected to a second (complementary) line of the complementary global input/output lines and responds to the read control signal. The fourth direct sense amplifier switch has an end connected to the other end of the third direct sense amplifier switch and the other end connected to ground and responds to a signal on a second (complementary) line of the complementary local input/output lines.

The read control signal is generated by a logical combination of the read signal and the block select signal.

The pair of write control switches includes a first switching device which has an end connected to one of the pair of complementary local input/output lines and responds to the block select signal, and a second switching device which has an end connected to the other end of the first switching device and the other end connected one of the pair of complementary global input/output lines and responds to the inverted signal of the read signal. Beneficially, the first and second switching devices are NMOS transistors.

BRIEF DESCRIPTION OF THE DRAWINGS

The above features and advantages of the present invention will become more apparent by describing in detail exemplary embodiments thereof with reference to the attached drawings in which.

DETAILED DESCRIPTION

Figure 1:
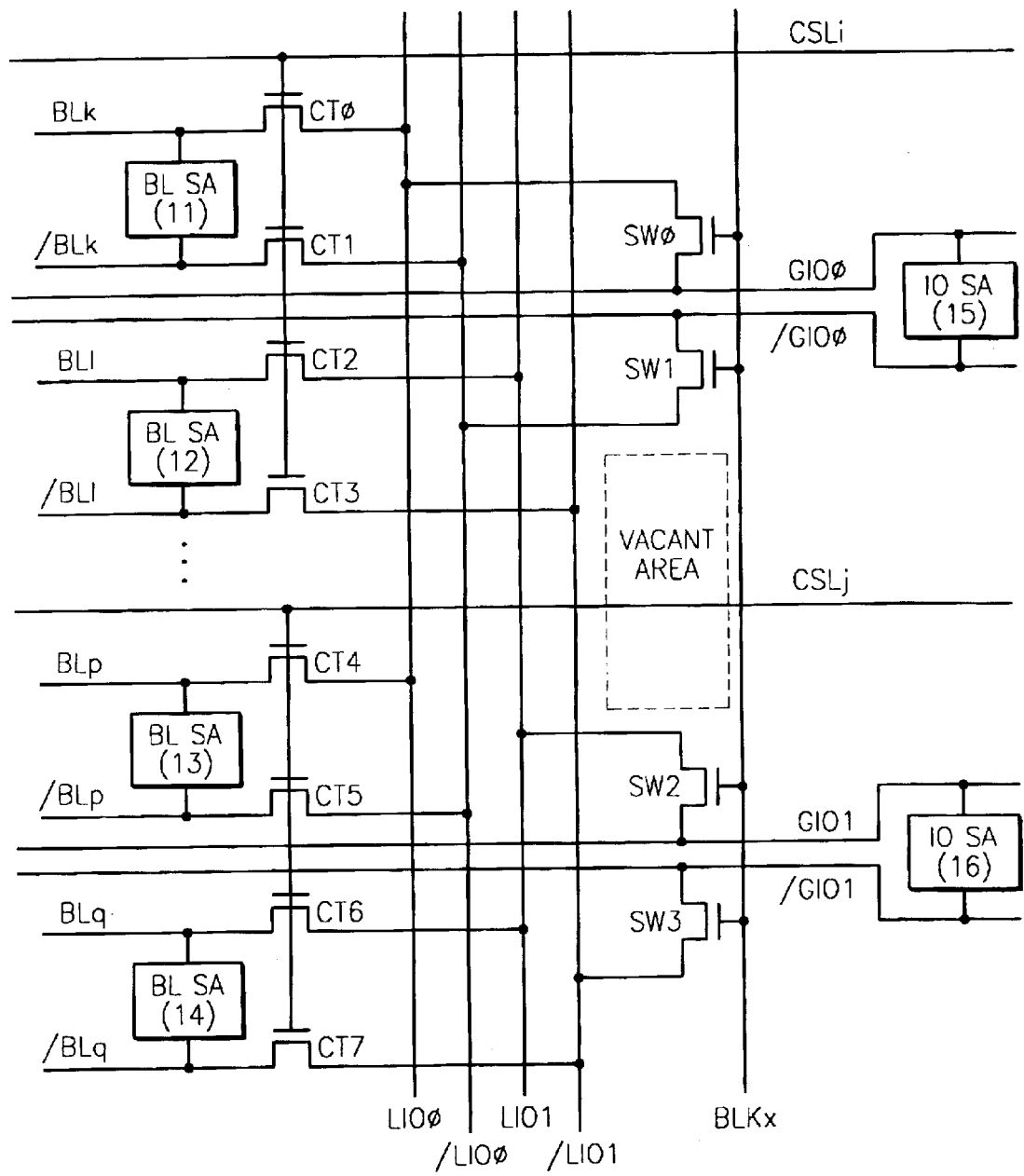
FIG. 1 is a circuit diagram of a semiconductor memory device having a hierarchical input/output line architecture.
Figure 2A:
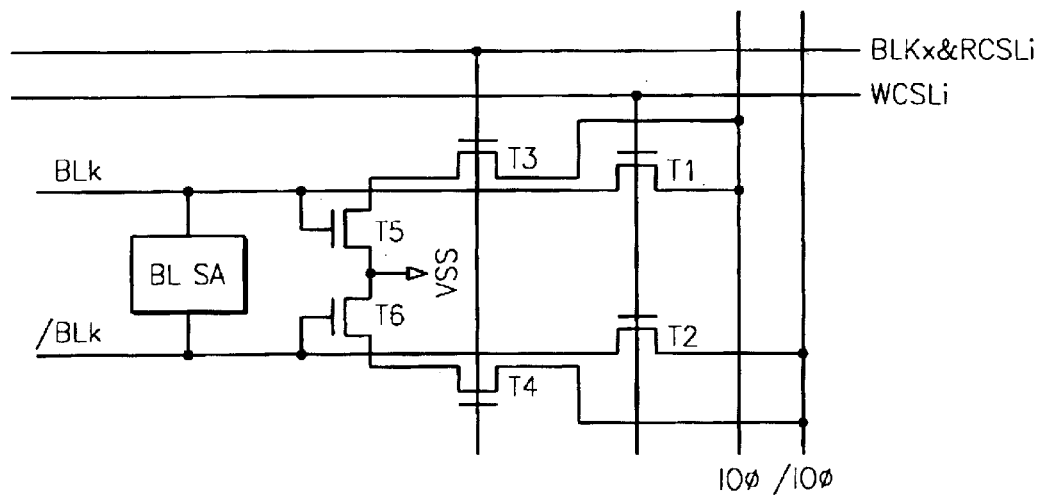
FIG. 2A is a circuit diagram of an example of the structure of a direct sense amplifier.
Figure 2B:
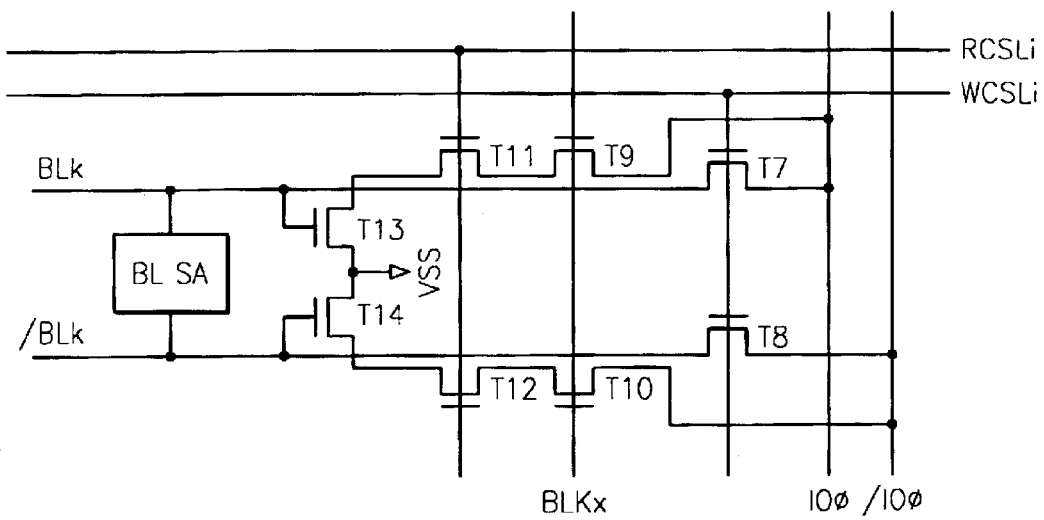
FIG. 2B is a circuit diagram of another example of the structure of a direct sense amplifier.

Attached drawings for illustrating preferred embodiments of the present invention, and the contents written on the attached drawings should be referred to in order to gain a sufficient understanding of the merits of the present invention and the operation thereof and the objectives accomplished by the operation of the present invention.

Hereinafter, the present invention will be described in detail by explaining preferred embodiments of the present invention with reference to the attached drawings. Like reference numerals in the drawings denote the same members.

Figure 3:
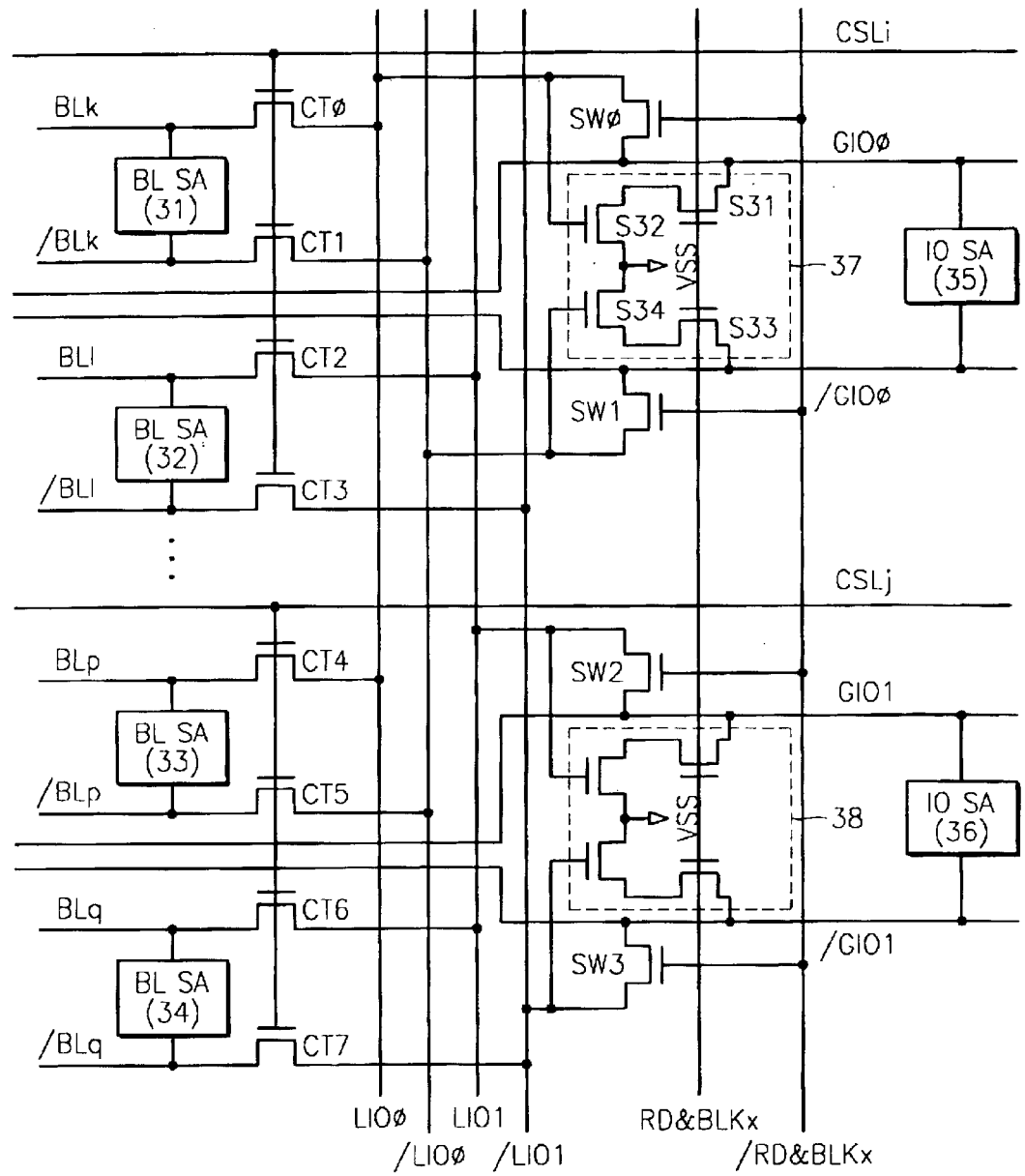
FIG. 3 is a circuit diagram of a semiconductor memory device, according to a first embodiment, having a direct sense amplifier implemented in a hierarchical input/output architecture.

FIG. 3 is a circuit diagram of a semiconductor memory device, according to a first embodiment, having direct sense amplifiers implemented in a hierarchical input/output line architecture. Referring to FIG. 3, the semiconductor memory device according to the first embodiment includes direct sense amplifiers 37 and 38 which are connected to pairs of local input/output lines LIO, /LIO and pairs of global input/output lines GIO, /GIO. The direct sense amplifiers 37 and 38 generate voltage differences, corresponding to voltage differences between pairs of local input/output lines LIO, /LIO, between pairs of global input/output lines GIO, /GIO in response to a read control signal RD&BLKx.

Bitline amplifiers 31 through 34 sense-amplify data of pairs of bitlines BL, /BL. Pairs of column select switches CT0 through CT7 are connected between the bitline sense amplifiers 31 through 34 and pairs of local input/output lines LIO, /LIO and respond to column select signals CSLi and CSLj. Write control switches SW0 through SW3 are connected between pairs of local input/output lines LIO, /LIO and pairs of global input/output lines GIO, /GIO and respond to a write control signal /RD&BLKx. Beneficially, pairs of column select switches CT0 through CT7 and pairs of write control switches SW0 through SW3 comprise NMOS transistors. The input/output line sense amplifiers 35 and 36 sense-amplify data of pairs of global input/output lines GIO, /GIO.

The read control signal RD&BLKx is generated by a logic combination of a read signal RD representing a read operation and a block select signal BLKx for a memory cell array block. The read control signal RD&BLKx is enabled when a specific memory cell array block is selected and is in a read operation. The write control signal /RD&BLK is generated by a logic combination of an inverted signal /RD of the read signal RD and the block select signal BLKx. The write control signal /RD&BLKx is enabled when a specific memory cell array block is selected and is not in the read operation.

The direct sense amplifiers 37 and 38 each include first through fourth direct sense amplifier switches S31 through S34. The first direct sense amplifier switch S31 has an end connected to a global input/output line GIO and responds to the read control signal RD&BLKx. The second direct sense amplifier switch S32 has an end connected to the other end of the first direct sense amplifier switch S31 and the other end connected to ground VSS and responds to a signal of a local input/output line LIO. Third direct sense amplifier switch S33 has an end connected to a complementary global input/output line /GIO and responds to the read control signal RD&BLKx. The fourth direct sense amplifier switch S34 has an end connected to the other end of the third direct sense amplifier switch S33 and the other end connected to the ground VSS and responds to a signal of a complementary local input/output line /LIO. Beneficially, the first through fourth direct sense amplifier switches S31 through S34 are NMOS transistors.

In a write operation, when the column select signals CSL are enabled and the write control signal /RD&BLKx is enabled, data transmitted via pairs of global input/output lines GIO, /GIO is delivered to pairs of local input/output lines LIO, /LIO via pairs of write control switches SW0 through SW3, and then data of pairs of local input/output lines LIO, /LIO is delivered to pairs of bitlines BL, /BL via pairs of column select switches CT0 through CT3.

In the read operation, data of pairs of bitlines BL, /BL is delivered to pairs of local input/output lines LIO, /LIO via pairs of column select switches CT0 through CT3. Next, the direct sense amplifiers 37 and 38 generate voltage differences corresponding to voltage differences between pairs of local input/output lines LIO, /LIO between pairs of global input/output lines GIO, /GIO in response to the activation of the read control signal RD&BLKx. In more detail, in the read operation, charge of pairs of global input/output lines GIO, /GIO is discharged to the ground VSS via the direct sense amplifier switches S31 and S32 and the direct sense amplifier switches S33 and S34 in the direct sense amplifiers 37 and 38. Here, the conductance of the direct sense amplifier switch S32 controlled by a voltage of a local input/output line LIO is different from the conductance of the direct sense amplifier switch S34 controlled by a voltage of a complementary local input/output line /LIO. Thus, the amount of discharge of a global input/output line GIO is different from the amount of discharge of a complementary global input/output line /GIO. As a result, a potential difference occurs between the global input/output line GIO and the complementary global input/output line /GIO. Data of pairs of global input/output lines GIO, /GIO is amplified by the input/output sense amplifiers 35 and 36.

Comparing the hierarchical input/output line architecture shown in FIG. 3 with the conventional hierarchical input/output line architecture, in the hierarchical input/output line architecture of FIG. 3, the direct sense amplifiers 37 and 38 having direct sense amplifier switches S31 through S34 are provided in each of pairs of global input/output lines GIO, /GIO. Meanwhile, in a hierarchical input/output line architecture, the number of write control switches SW0 through SW3 connecting pairs of local input/output lines LIO, /LIO and pairs of global input/output lines GIO, /GIO is limited to the number of local input/output lines LIO, /LIO or the number of global input/output lines GIO, /GIO. Due to this, in the conventional hierarchical input/output line architecture shown in FIG. 1, a vacant area exists. Thus, the direct sense amplifiers 37 and 38 may be disposed in the vacant area. As a result, direct sense amplifiers can be implemented without increasing the chip area. Also, in the hierarchical input/output line architecture of FIG. 3, since a write column select line and a read column select line are separately not required, the number of interconnection lines does not increase.

Figure 4:
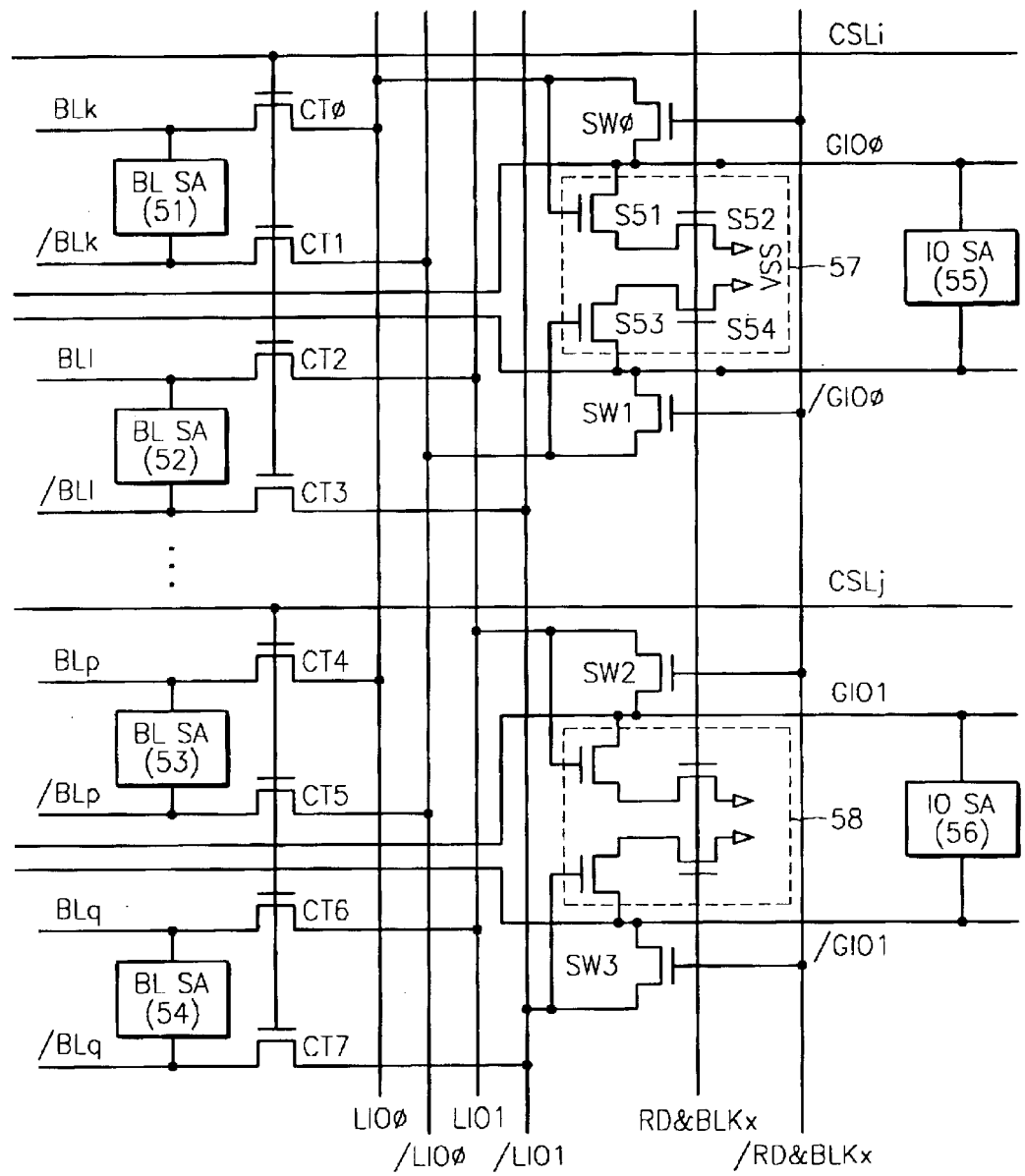
FIG. 4 is a circuit diagram of a semiconductor memory device, according to a second embodiment, having a direct sense amplifier implemented in a hierarchical input/output architecture.

FIG. 4 is a circuit diagram of a semiconductor memory device, according to a second embodiment, having a direct sense amplifier implemented in a hierarchical input/output architecture. Referring to FIG. 4, the semiconductor memory device according to the second embodiment includes pairs of bitlines BL, /BL, bitline sense amplifiers 51 through 54, pairs of column select switches CT0 through CT7, pairs of local input/output lines LIO, /LIO, pairs of write control switches SW0 through SW3, pairs of global input/output lines GIO, /GIO, input/output line sense amplifiers 55 and 56, and direct sense amplifiers 57 and 58. The semiconductor memory device according to the second embodiment is identical to the semiconductor memory device according to the first embodiment except the structures of the direct sense amplifiers 57 and 58.

The direct sense amplifiers 57 and 58 each include first through fourth direct sense amplifier switches S51 through S54. The first direct sense amplifier switch S51 has an end connected to a global input/output line GIO and responds to a signal of a local input/output line LIO. The second direct sense amplifier switch S52 has an end connected to the other end of the first direct sense amplifier switch S51 and the other end connected to ground VSS and responds to a read control signal RD&BLKx. The third direct sense amplifier switch S53 has an end connected to a complementary global input/output line /GIO and responds to a signal of a complementary local input/output line /LIO. The fourth direct sense amplifier switch S54 has an end connected the other end of the third direct sense amplifier switch S53 and the other end connected to the ground VSS and responds to the read control signal RD&BLKx. Beneficially, the first through fourth direct sense amplifier switches S51 through S54 are NMOS transistors.

Write and read operations of the semiconductor memory device according to the second embodiment shown in FIG. 4 are the same as the write and read operations of the semiconductor memory device according to the first embodiment shown in FIG. 3.

In the first and second embodiments, the read control signal RD&BLKx and the write control signal /RD&BLKx are generated by the logic combination of the read signal RD representing the read operation and the block select signal BLKx for the memory cell array block. Thus, there is a drawback in that a predetermined time is required for the logic combination of the read signal RD and the block select signal BLKx. This drawback can be overcome by dividing the read control signal RD&BLKx and/or the write control signal /RD&BLKx into the read signal RD and the block select signal BLKx.

Figure 5:
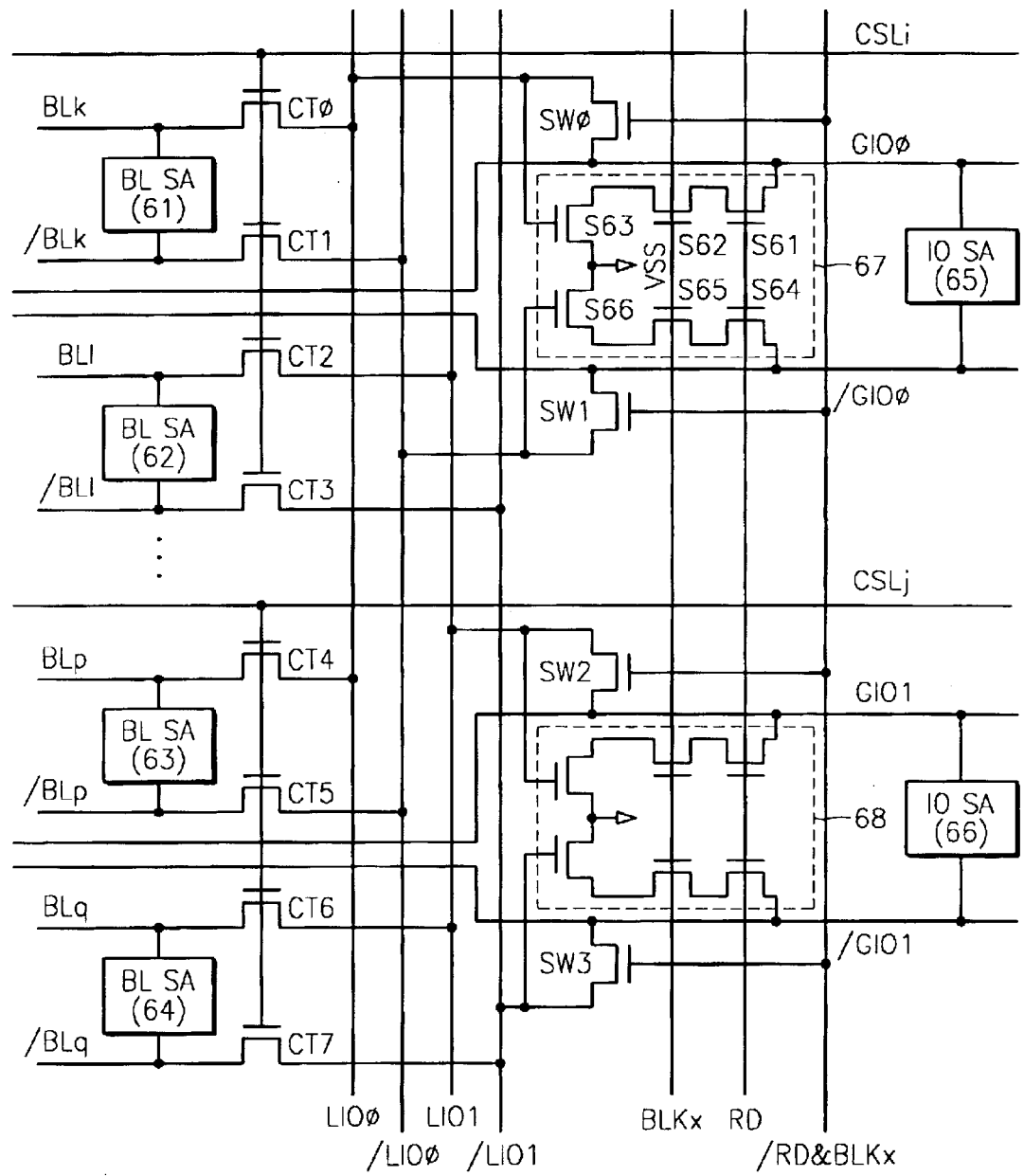
FIG. 5 is a circuit diagram of a semiconductor memory device, according to a third embodiment, having a direct sense amplifier implemented in a hierarchical input/output architecture.

FIG. 5 is a circuit diagram of a semiconductor memory device, according to a third embodiment, having a direct sense amplifier implemented in a hierarchical input/output architecture. Here, the read control signal is divided into a read signal RD and a block select signal BLKx. Referring to FIG. 5, the semiconductor memory device according to the third embodiment includes pairs of bitlines BL, /BL, bitline sense amplifiers 61 through 64, pairs of column select switches CT0 through CT7, pairs of local input/output lines LIO, /LIO, pairs of write control switches SW0 through SW3, pairs of global input/output lines GIO, /GIO, input/output line sense amplifiers 65 and 66, and direct sense amplifiers 67 and 68. The semiconductor memory device according to the third embodiment is identical to the semiconductor memory device according to the first embodiment, except for the structures of the direct sense amplifiers 67 and 68, and the read control signal RD&BLK being separated into the read signal RD and the block select signal BLKx.

The direct sense amplifiers 67 and 68 are connected to pairs of local input/output lines LIO, /LIO and pairs of global input/output lines GIO, /GIO, and generate voltage differences, corresponding to voltage differences between pairs of local input/output lines LIO, /LIO, between pairs of global input/output lines GIO, /GIO directly in response to the read signal RD and the block select signal BLKx. The direct sense amplifiers 67 and 68 each include first through sixth direct sense amplifier switches S61 through S66. The first direct sense amplifier switch S61 has an end connected to a global input/output line GIO and responds to the read signal RD. The second direct sense amplifier switch S62 has an end connected to the other end of the first direct sense amplifier switch S61 and responds to the block select signal BLKx. The third direct sense amplifier switch S63 has an end connected to the other end of the second direct sense amplifier switch S62 and the other end connected to ground VSS and responds to a signal of a local input/output line LIO. The fourth direct sense amplifier switch S64 has an end connected to a complementary global input/output line /GIO and responds to the read signal RD. The fifth direct sense amplifier switch S65 has an end connected to the other end of the fourth direct sense amplifier switch S64 and responds to the block select signal BLKx. The sixth direct sense amplifier switch S66 has an end connected to the other end of the fifth direct sense amplifier switch S65 and the other end connected to the ground VSS and responds to a signal of a complementary local input/output line /LIO. Beneficially, the first through sixth direct sense amplifier switches S61 through S66 are NMOS transistors. The order of arrangements of the first through sixth direct sense amplifier switches S61 through S66 in the direct sense amplifiers 67 and 68 may vary.

Figure 6:
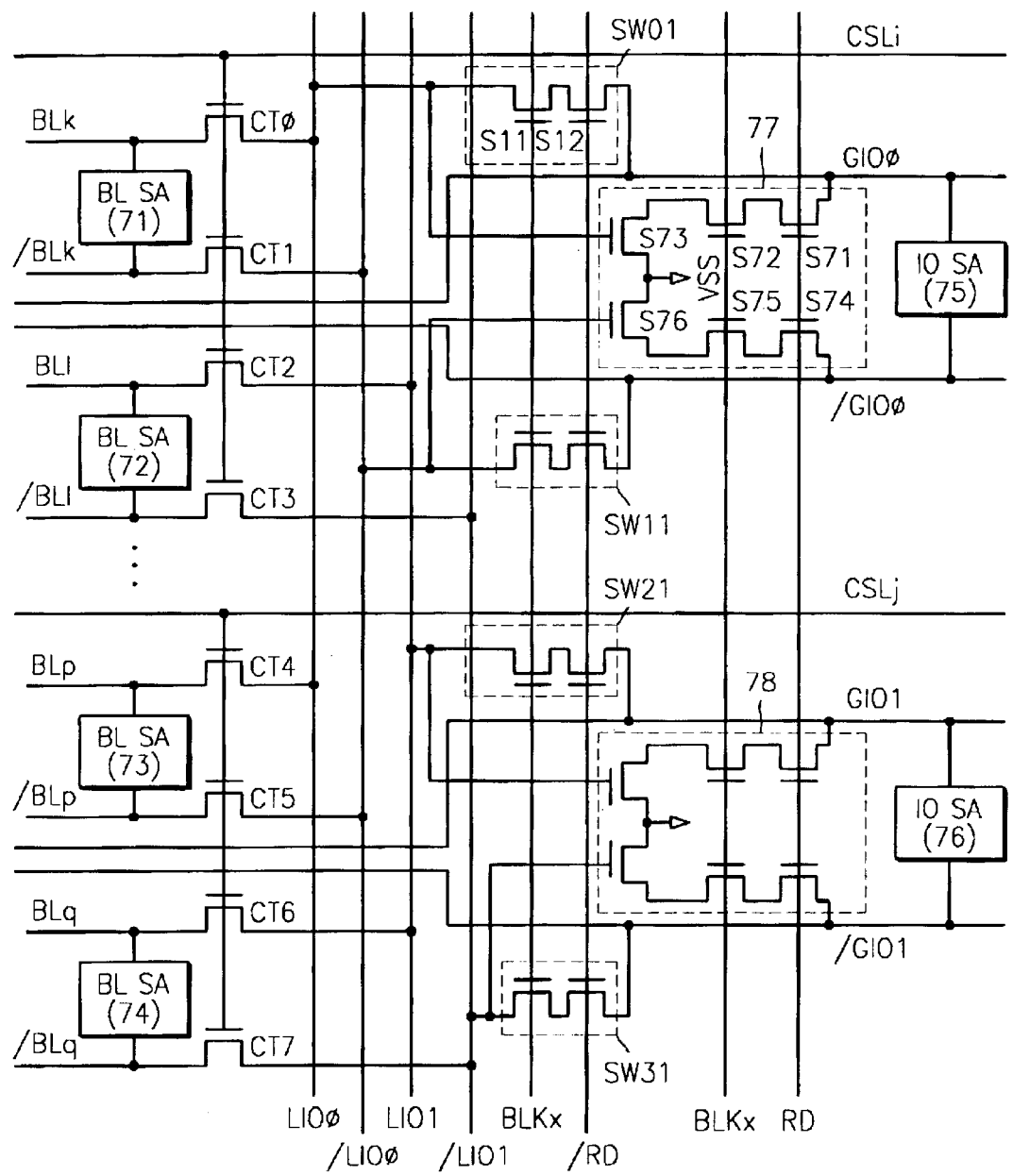
FIG. 6 is a circuit diagram of a semiconductor memory device, according to a fourth embodiment, having a direct sense amplifier implemented in a hierarchical input/output architecture.

FIG. 6 is a circuit diagram of a semiconductor memory device, according to a fourth embodiment, having a direct sense amplifier implemented in a hierarchical input/output architecture. Here, a read control signal RD&BLKx or a write control signal /RD&BLKx is divided into a read signal RD (or /RD) and a block select signal BLKx. Referring to FIG. 6, the semiconductor memory device according to the fourth embodiment includes pairs of bitlines BL, /BL, bitline sense amplifiers 71 through 74, pairs of column select switches CT0 through CT7, pairs of local input/output lines LIO, /LIO, pairs of write control switches SW01, SW11, SW21, and SW31, pairs of global input/output lines GIO, /GIO, input/output line sense amplifiers 75 and 76, and direct sense amplifiers 77 and 78. The semiconductor memory device according to the fourth embodiment is the same as the semiconductor memory device according to the first embodiment, except for the structures of the direct sense amplifiers 77 and 78 and the structures of pairs of write control switches SW01, SW11, SW21, and SW31. Also, the read control signal RD&BLKx is divided into the read signal RD and the block select signal BLKx and the write control signal /RD&BLKx is divided into an inverted read signal /RD and a block select signal BLKx.

The direct sense amplifiers 77 and 78 are connected to pairs of local input/output lines LIO, /LIO, pairs of global input/output lines GIO, /GIO and generate voltage differences, corresponding to voltage differences between pairs of local input/output lines LIO, /LIO, between pairs of global input/output lines GIO, /GIO directly in response to the read signal RD and the block select signal BLKx. Pairs of write control switches SW01, SW11, SW21, and SW31 are connected between pairs of local input/output lines LIO, /LIO and pairs of global input/output lines GIO, /GIO and respond to the inverted read signal /RD and the block select signal BLKx.

The direct sense amplifiers 77 and 78 each include first through sixth direct sense amplifier switches S71 through S76. The first direct sense amplifier switch S71 has an end connected a global input/output line GIO and responds to the read signal RD. The second direct sense amplifier switch S72 has an end connected to the other end of the first direct sense amplifier switch S71 and responds to the block select line BLKx. The third direct sense amplifier switch S73 has an end connected to the other end of the second direct sense amplifier switch 72 and the other end connected to ground VSS and responds to a signal of a local input/output line LIO. The fourth direct sense amplifier switch S74 has an end connected to a complementary global input/output line /GIO and responds to the read signal RD. The fifth direct sense amplifier switch S75 has an end connected to the other end of the fourth direct sense amplifier switch S74 and responds to the block select signal BLKx. The sixth direct sense amplifier switch S76 has an end connected to the other end of the fifth direct sense amplifier switch S75 and the other end connected to ground VSS and responds to a signal of a complementary local input/output line /LIO. Beneficially, the first through sixth direct sense amplifier switches S71 through S76 are NMOS transistors. The order of in which the first through sixth direct sense amplifier switches S71 through S76 in the direct sense amplifiers 77 and 78 are arranged may vary.

The write control switches SW01, SW11, SW21, and SW31 each include first and second switching devices S11 and S12. The first switching device S11 has an end connected to one of a pair of local input/output lines LIO, /LIO and responds to the block select signal BLKx. The second switching device S12 has an end connected to the other end of the first switching device S11 and the other end connected to one of a pair of global input/output lines GIO, /GIO and responds to the inverted read signal /RD. Beneficially, the first and second switching devices S11 and S12 are NMOS transistors. The order in which the first and second switching devices S11 and S12 are arranged in the write control switches SW01, SW11, SW21, and SW31 may vary.

Figure 7:
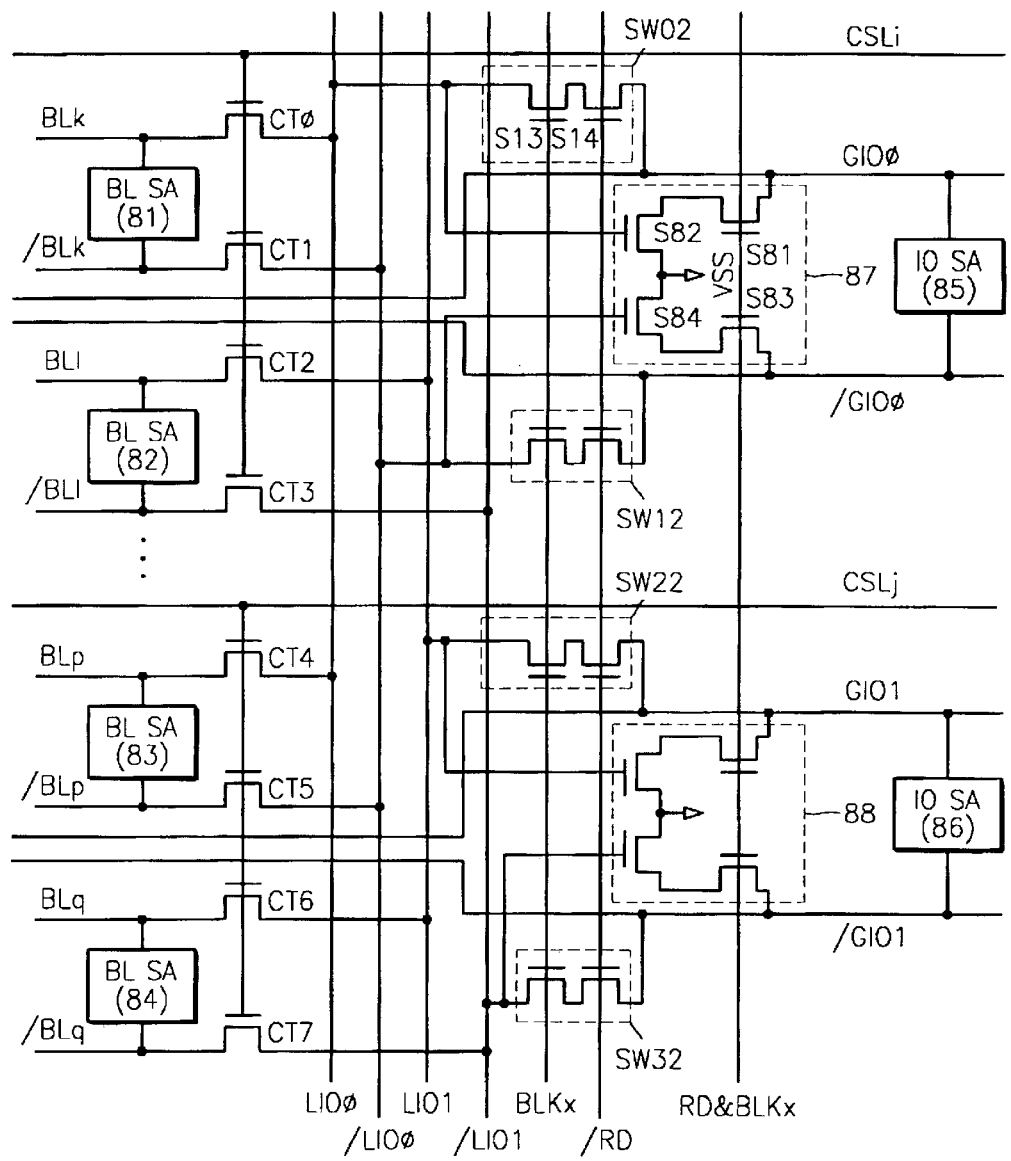
FIG. 7 is a circuit diagram of a semiconductor memory device, according to a fifth embodiment, having a direct sense amplifier implemented in a hierarchical input/output architecture.

FIG. 7 is a circuit diagram of a semiconductor memory device, according to a fifth embodiment, having a direct sense amplifier implemented in a hierarchical input/output architecture. Here, only a write control signal is divided into a complementary read signal /RD and a block select signal BLKx. Referring to FIG. 7, the semiconductor memory device according to the fifth embodiment includes pairs of bitline BL, /BL, bitline sense amplifiers 81 through 84, pairs of column select switches CT0 through CT7, pairs of local input/output lines LIO, /LIO, pairs of write control switches SW02, SW12, SW22, and SW32, pairs of global input/output lines GIO, /GIO, input/output line sense amplifiers 85 and 86, and direct sense amplifiers 87 and 88. The semiconductor memory device according to the fifth embodiment is identical to the semiconductor memory device according to the first embodiment, except for the structures of pairs of write control switches SW02, SW12, SW22, and SW32, and the write control signal /RD&BLKx being separated into an inverted read signal /RD and a block select signal BLKx.

Pairs of write control switches SW02, SW12, SW22, and SW32 are connected between pairs of local input/output lines LIO, /LIO and pairs of global input/output lines GIO, /GIO and respond to the inverted read signal /RD and the block select signal BLKx. The direct sense amplifiers 77 and 78 are connected to pairs of local input/output lines LIO, /LIO and pairs of global input/output lines GIO, /GIO and generate voltage differences, corresponding to voltage differences between pairs of local input/output lines LIO, /LIO, between pairs of global input/output lines GIO, /GIO directly in response to the read control signal RD&BLKx. The read control signal RD&BLKx is generated by a logic combination of the read signal RD and the block select signal BLKx.

The write control switches SW02, SW12, SW22, and SW32 each include first and second switching device S13 and S14. The first switching device S13 has an end connected one of a pair of local input/output line LIO, /LIO and responds to the block select signal BLKx. The second switching device S14 has an end connected to the other end of the first switching device S13 and the other end connected to one of a pair of global input/output lines GIO, /GIO and responds to the inverted read signal /RD. Beneficially, the first and second switching devices S13 and S14 are NMOS transistors. The order in which the first and second switching devices S13 and S14 are arranged may vary.

The direct sense amplifiers 87 and 88 each include first through fourth direct sense amplifier switches S81 through S84. The first direct sense amplifier switch S81 has an end connected to a global input/output line GIO and responds to the read control signal RD&BLKx. The second direct sense amplifier switch S82 has an end connected to the other end of the first direct sense amplifier switch S81 and the other end connected to ground VSS and responds to a signal of a local input/output line LIO. The third direct sense amplifier switch S83 has an end connected to a complementary global input/output line /GIO and responds to the read control signal RD&BLKx. The fourth direct sense amplifier switch S84 has an end connected to the other end of the third direct sense amplifier switch S83 and the other end connected to the ground VSS and responds to a signal of a complementary local input/output line /LIO. Beneficially, the first through fourth direct sense amplifier switches S81 thorough S84 are NMOS transistors. The order in which the first through fourth direct sense amplifier switches S81 through S84 are arranged in the direct sense amplifiers 87 and 88 may vary.

As described above, in a semiconductor memory device as disclosed herein, a direct sense amplifier is provided for each pair of global input/output lines GIO, /GIO. The direct sense amplifier may be disposed in the vacant area shown in FIG. 1 which is necessarily formed in a hierarchical input/output line architecture. Thus, a direct sense amplifier can be implemented without increasing the chip area. Also, in a semiconductor memory device as disclosed herein since a write column select line and a read column select line are separately required, the number of interconnection lines does not increase.

Although the invention has been described with reference to the embodiments shown in the drawings, the drawings are for illustration purpose only. However, the scope of the present invention must not be interpreted as being restricted to the embodiments. Therefore, it will be apparent to one of ordinary skill in the art that modifications of the described embodiments may be made without departing from the spirit and scope of the invention. Consequently, the true scope of the present invention must be determined based on the appended claims.

What is claimed is:

1. A semiconductor memory device comprising:
   a bitline sense amplifier adapted to sense-amplify data of a pair of bitlines;
   a pair of complementary local input/output lines;
   a pair of column select switches connected between the bitline sense amplifier and the pair of complementary local input/output lines, said column select switches being adapted to respond to a column select signal;
   a pair of complementary global input/output lines;
   a pair of write control switches connected between the pair of complementary local input/output lines and the pair of complementary global input/output lines, said write control switches being adapted to respond to a write control signal; and
   a direct sense amplifier connected to the pair of complementary local input/output lines and the pair of complementary global input/output lines, said direct sense amplifier being adapted to generate a voltage difference, corresponding to a voltage difference between the pair of complementary local input/output lines, between the pair of complementary global input/output lines in response to a read control signal, said direct sense amplifier comprising,
      a first direct sense amplifier switch having a first end connected to a first one of the complementary global input/output lines, and being adapted to respond to a signal on a first one of the complementary local input/output lines;
      a second direct sense amplifier switch having a first end connected to a second end of the first direct sense amplifier switch, and having a second end connected to ground, and being adapted to respond to the read control signal;
      a third direct sense amplifier switch having a first end connected to a second one of the complementary global input/output lines, and being adapted to respond to a signal on a second one of the complementary local input/output lines; and
      a fourth direct sense amplifier switch, having a first end connected to a second end of the third direct sense amplifier switch, and having a second end connected to ground, and being adapted to respond to the read control signal.

2. The semiconductor memory device of claim 1, further comprising an input/output line sense amplifier being adapted to sense-amplify data of the pair of complementary global input/output lines.

3. The semiconductor memory device of claim 1, wherein the first through fourth direct sense amplifier switches are NMOS transistors.

4. The semiconductor memory device of claim 1, wherein the write control signal is generated by a logical combination of an inverted signal of a read signal representing a read operation and a block select signal for a memory cell array block.

5. The semiconductor memory device of claim 4, wherein the read control signal is generated by a logic combination of the read signal and the block select signal.

6. A semiconductor memory device comprising:
   a bitline sense amplifier adapted to sense-amplify data of a pair of bitlines;
   a pair of complementary local input/output lines;
   a pair of column select switches connected between the bitline sense amplifier and the pair of complementary local input/output lines, said column select switches being adapted to respond to a column select signal;
   a pair of complementary global input/output lines;
   a pair of write control switches connected between the pair of complementary local input/output lines and the pair of complementary global input/output lines, said write control switches being adapted to respond to a write control signal; and
   a direct sense amplifier connected to the pair of complementary local input/output lines and the pair of complementary global input/output lines, said direct sense amplifier being adapted to generate a voltage difference, corresponding to a voltage difference between the pair of complementary local input/output lines, between the pair of complementary global input/output lines in response to a read signal representing a read operation and a block select signal for a memory cell array block, said direct sense amplifier comprising,
      a first direct sense amplifier switch, having a first end connected to a first one of the global input/output lines, and being adapted to respond to the read signal;
      a second direct sense amplifier switch, having a first end connected to a second end of the first direct sense amplifier switch, and being adapted to respond to the block select signal;
      a third direct sense amplifier switch, having a first end connected to a second end of the second direct sense amplifier switch, and having a second end connected to ground, and being adapted to respond to a signal on a first one of the complementary local input/output lines;
      a fourth direct sense amplifier switch, having a first end connected to a second one of the global input/output lines, and being adapted to respond to the read signal;
      a fifth direct sense amplifier switch, having a first end connected to a second end of the fourth direct sense amplifier switch, and being adapted to respond to the block select signal; and
      a sixth direct sense amplifier switch, having a first end connected to a second end of the fifth direct sense amplifier switch, and having a second end connected to ground, and being adapted to respond to a signal on a second one of the complementary local input/output lines.

7. The semiconductor memory device of claim 6, further comprising an input/output line sense amplifier being adapted to sense-amplify data of the pair of complementary global input/output lines.

8. The semiconductor memory device of claim 6, wherein the first through sixth direct sense amplifier switches are NMOS transistors.

9. The semiconductor memory device of claim 6, wherein the write control signal is generated by a logical combination of an inverted signal of the read signal and the block select signal.

10. A semiconductor memory device comprising:
a bitline sense amplifier adapted to sense-amplify data of a pair of bitlines;
a pair of complementary local input/output lines;
a pair of column select switches connected between the bitline sense amplifier and the pair of complementary local input/output lines, the column select switches being adapted to respond to a column select signal;
a pair of complementary global input/output lines;
a pair of write control switches connected between the pair of complementary local input/output lines and the pair of complementary global input/output lines, said write control switches being adapted to respond to an inverted signal of a read signal representing a read operation and a block select signal for a memory cell array block; and
a direct sense amplifier connected to the pair of complementary local input/output lines and the pair of complementary global input/output lines, said direct sense amplifier being adapted to generate a voltage difference, corresponding to a voltage difference between the pair of complementary local input/output lines, between the pair of complementary global input/output lines in response to the read signal and the block select signal, said direct sense amplifier comprising,
a first direct sense amplifier switch, having a first end connected to a first one of the global input/output lines, and being adapted to respond to the read signal;
a second direct sense amplifier switch, having a first end connected to a second end of the first direct sense amplifier switch, and being adapted to respond to the block select signal;
a third direct sense amplifier switch, having a first end connected to a second end of the second direct sense amplifier switch, and having a second end connected to ground, and being adapted to respond to a signal on a first one of the complementary local input/output lines;
a fourth direct sense amplifier switch, having a first end connected to a second one of the complementary global input/output lines, and being adapted to respond to the read signal;
a fifth direct sense amplifier switch, having a first end connected to the other end of the fourth direct sense amplifier switch, and being adapted to respond to the block select signal; and
a sixth direct sense amplifier switch, having a first end connected to a second end of the fifth direct sense amplifier switch, and having a second end connected to the ground, and being adapted to respond to a signal of a second one of the complementary local input/output lines.

11. The semiconductor memory device of claim 10, further comprising an input/output line sense amplifier which sense-amplifies data of the pair of complementary global input/output lines.

12. The semiconductor memory device of claim 10, wherein the first through sixth direct sense amplifier switches are NMOS transistors.

13. The semiconductor memory device of claim 10, wherein each of the write control switches comprises:
a first switching device, having a first end connected to one of the pair of complementary local input/output lines, and being adapted to respond to the block select signal; and
a second switching device, having a first end connected to a second end of the first switching device, and having a second end connected to one of the pair of complementary global input/output lines, and being adapted to respond to the inverted signal of the read signal.

14. The semiconductor memory device of claim 13, wherein the first and second switching devices are NMOS transistors.

15. A semiconductor memory device comprising:
a bitline sense amplifier adapted to sense-amplify data of a pair of bitlines;
a pair of complementary local input/output lines;
a pair of column select switches connected between the bitline sense amplifier and the pair of complementary local input/output lines, said column select switches being adapted to respond to a column select signal;
a pair of complementary global input/output lines;
a pair of write control switches connected between the pair of complementary local input/output lines and the pair of complementary global input/output lines, and responds to an inverted signal of a read signal representing a read operation and a block select signal for a memory cell array block, said pair of write control switches comprising,
a first switching device, having a first end connected to one of the pair of complementary local input/output lines, and being adapted to respond to the block select signal; and
a second switching device, having a first end connected to a second end of the first switching device, and having a second end connected to one of the pair of complementary global input/output lines, and being adapted to respond to the inverted signal of the read signal; and
a direct sense amplifier connected to the pair of complementary local input/output lines and the pair of complementary global input/output lines, and adapted to generate a voltage difference, corresponding to a voltage difference between the pair of complementary local input/output lines, between the pair of complementary global input/output lines in response to a read control signal.

16. The semiconductor memory device of claim 15, further comprising an input/output line sense amplifier which sense-amplifies data of the pair of complementary global input/output lines.

17. The semiconductor memory device of claim 15, wherein the direct sense amplifier comprises:
a first direct sense amplifier switch, having a first end connected the global input/output line, and being adapted to respond to the read control signal;
a second direct sense amplifier switch, having a first end connected to a second end of the first direct sense amplifier switch, and having a second end connected to ground, and being adapted to respond to a signal of a first one of the complementary local input/output lines;
a third direct sense amplifier switch, having a first connected to a second one of the complementary global input/output lines, and being adapted to respond to the read control signal; and
a fourth direct sense amplifier switch, having a first end connected to a second end of the third direct sense amplifier switch, and having a second end connected to ground, and being adapted to respond to a signal on a second one of the complementary local input/output lines.

18. The semiconductor memory device of claim 17, wherein the first through fourth direct sense amplifier switches are NMOS transistors.

19. The semiconductor memory device of claim 15, wherein the first and second switching devices are NMOS transistors.

20. The semiconductor memory device of claim 15, wherein the read control signal is generated by a logical combination of the read signal and the block select signal.

21. The semiconductor memory device of claim 15, wherein the pair of write control switches further comprises:

a third switching device, having a first end connected to another one of the pair of complementary local input/output lines, and being adapted to respond to the block select signal; and a fourth switching device, having a first end connected to a second end of the third switching device, and having a second end connected to another one of the pair of complementary global input/output lines, and being adapted to respond to the inverted signal of the read signal.

* * * * *